US008115207B2

(12) United States Patent
Kim et al.

(10) Patent No.: US 8,115,207 B2
(45) Date of Patent: Feb. 14, 2012

(54) VACUUM CHANNEL TRANSISTOR AND DIODE EMITTING THERMAL CATHODE ELECTRONS, AND METHOD OF MANUFACTURING THE VACUUM CHANNEL TRANSISTOR

(75) Inventors: Dae Yong Kim, Daejeon (KR); Hyun Tak Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/606,317

(22) Filed: Oct. 27, 2009

(65) Prior Publication Data

US 2010/0102325 A1 Apr. 29, 2010

(30) Foreign Application Priority Data

Oct. 29, 2008 (KR) ........................ 10-2008-0106581

(51) Int. Cl.
*H01L 29/76* (2006.01)

(52) U.S. Cl. ............ 257/66; 257/67; 313/336; 313/309; 313/351; 313/496

(58) Field of Classification Search .................... 257/66, 257/67; 313/336, 309, 351, 496
See application file for complete search history.

(56) References Cited

U.S. PATENT DOCUMENTS 4,827,177 A 5/1989 Lee et al.
5,012,153 A * 4/1991 Atkinson et al. .............. 313/336
6,727,642 B1 * 4/2004 Cho et al. ...................... 313/496

FOREIGN PATENT DOCUMENTS

KR 1999-0077954 10/1999
KR 100351068 B1 8/2002
KR 2008-0093689 A 10/2008
WO WO-99/49492 A1 9/1999

* cited by examiner

*Primary Examiner* — Long Pham
(74) *Attorney, Agent, or Firm* — Rabin & Berdo, P.C.

(57) ABSTRACT

Provided are a transistor and a method of manufacturing the transistor, and more particularly, a vacuum channel transistor emitting thermal cathode electrons and a method of manufacturing the vacuum channel transistor. The vacuum channel transistor includes: a motherboard; a micro heater member having a thin-film structure formed on the motherboard; a cathode member having a thin-film structure spaced apart from a center part of the micro heater member by a first interval and formed on the micro heater member; a gate member formed on both outer walls of upper parts of the cathode member; and an anode member spaced apart from the cathode member by a second interval through spacers disposed on the gate member, wherein a vacuum electron passing area is interposed between the cathode member and the anode member by the second interval.

8 Claims, 10 Drawing Sheets

VACUUM CHANNEL TRANSISTOR AND DIODE EMITTING THERMAL CATHODE ELECTRONS, AND METHOD OF MANUFACTURING THE VACUUM CHANNEL TRANSISTOR

CROSS-REFERENCE TO RELATED PATENT APPLICATION

This application claims the benefit of Korean Patent Application No. 10-2008-0106581, filed on Oct. 29, 2008, in the Korean Intellectual Property Office, the disclosure of which is incorporated herein in its entirety by reference.

BACKGROUND OF THE INVENTION

1. Field of the Invention

The present invention relates to a transistor, and more particularly, to a vacuum channel transistor emitting thermal cathode electrons having a low driving voltage and stably emitting electrons and a method of manufacturing the vacuum channel transistor.

2. Description of the Related Art

In general, field emission devices apply an electric field to an electrode, that is, a cathode, in vacuum or under a specific gas atmosphere, and electrons are emitted from the cathode. The field emission devices are called cold cathodes and are used as an electron source of micro devices, sensors, and flat panel displays. In such field emission devices, the efficiency of emitting electrons varies according to the structure of the field emission devices, electrode materials, and the shape of the electrode.

Conventional field emission devices may be classified as a diode type formed of a cathode and an anode and a triode type formed of a cathode, a gate, and an anode. In the triode-type field emission devices, an electric field is applied to the gate adjacent to the cathode. Thus, the triode-type field emission devices may be driven in a lower voltage than that of the diode-type field emission devices. Also, current emitted to the anode and the gate of the triode-type field emission devices may be easily controlled and thus the triode-type field emission devices are being widely developed. Examples of the electrode materials of the field emission devices may include metal, silicon, and diamond. When silicon is selected as the electrode material, semiconductor processing equipment may be used and the field emission devices may be manufactured by being compatible with a semiconductor integrated circuit process.

However, due to a characteristic of the field emission devices in which electrons cut through the sharp surface of the cathode, electrical characteristics thereof are unstable, the uniformity of the electrical characteristics between the anode and the cathode is poor, and damage to the field emission devices due to excessive current may easily occur. For example, since the conventional field emission devices generally employ a sharp cathode tip structure, instability of emitting current, low efficiency, short life time, and low mass production may exist due to degradation of the tip in the cathode tip structure. In addition, the driving voltage for emitting electrons is very high in the conventional field emission devices.

SUMMARY OF THE INVENTION

The present invention provides a vacuum channel transistor that emits thermal cathode electrons, provides a stable electron emission structure, has a low driving voltage, and improves mass production, a diode, and a method of manufacturing the vacuum channel transistor.

According to an aspect of the present invention, there is provided a vacuum channel transistor including: a motherboard; a micro heater member having a thin-film structure formed on the motherboard; a cathode member having a thin-film structure spaced apart from a center part of the micro heater member by a first interval and formed on the micro heater member; a gate member formed on both outer walls of upper parts of the cathode member; and an anode member spaced apart from the cathode member by a second interval through spacers disposed on the gate member, wherein a vacuum electron passing area is formed between the cathode member and the anode member by the second interval.

A lower center part of the motherboard may be removed through etching in order for the micro heater member to have a thin-film structure, wherein the micro heater member includes a silicon oxide film formed on the motherboard; a polycrystal silicon film formed on the silicon oxide film on which a center part of the polycrystal silicon film has a smaller thickness than that of an outer wall of the polycrystal silicon film; and a low work function material layer formed on the center part of the polycrystal silicon film, and wherein the micro heater member has a structure where the center part thereof is projected downward, a lower center part of the silicon oxide film is exposed by removing a part of the motherboard, and the center part of the polycrystal silicon film functions as a local micro heater.

The cathode member may include: a polycrystal silicon film formed on the micro heater member; and a cathode formed on a center part of the polycrystal silicon film using a low work function material layer; wherein the cathode member is stacked on an upper surface of the micro heater member through a silicon oxide film formed on both outer walls of upper parts of the micro heater member, the micro heater member has a structure where the center part thereof is projected downward, and the low work function material layer of the cathode, which is formed on the micro heater member, and the polycrystal silicon film are spaced apart from each other by the first interval.

The gate member may include: a first silicon oxide film formed on both outer walls of the upper parts of the cathode member; a crystal silicon gate formed on the first silicon oxide film; and a second silicon oxide film formed on the crystal silicon gate.

The anode member may include: a silicon substrate having a center part thereof projected downward; a silicon oxide film formed on a lower surface of the silicon substrate and not formed on a predetermined part of the center part of the silicon substrate; and an anode formed on a lower surface of the center part of the silicon oxide film and on the predetermined part of the center part of the silicon substrate using a metal layer.

The gate member may include the first silicon oxide film, the crystal silicon gate, and the second silicon oxide film that are sequentially formed on both outer walls of the upper parts of the cathode member, the spacers are formed on the second silicon oxide film, the anode member is stacked on the spacers so that the anode of the anode member and the cathode of the cathode member are spaced apart from each other by the second interval, and thus the electron passing area is formed for electrons emitted from the cathode to reach the anode.

According to another aspect of the present invention, there is provided a diode having a cathode-anode structure including: a motherboard; a cathode member having a thin-film structure spaced apart from a center part of the motherboard by a first interval and comprising a local micro heater at a center part of the cathode member; an anode member spaced apart from the cathode member by a second interval through spacers disposed on the cathode member; wherein a vacuum electron passing area is formed between the cathode member and the anode member by the second interval.

According to another aspect of the present invention, there is provided a method of manufacturing a vacuum channel transistor, the method including: forming a micro heater member on a motherboard; forming a cathode member on the micro heater member; forming a gate member on both outer walls of upper parts of the cathode member; removing predetermined materials layers of a low work function material layer of the micro heater member so as for the cathode member to be spaced apart from the low work function material layer of the micro heater member by a first interval; forming an upper structure in which an anode is formed on a part of a silicon substrate; and combining the upper structure to the gate member by spacers so as to form a vacuum electron passing area with a second interval between the anode and the cathode member.

The forming of the micro heater member may include: defining an active area on the motherboard and etching the active area by a predetermined depth so as to form a trench in the motherboard; forming a silicon oxide film on the resultant motherboard; forming a polycrystal silicon film on the silicon oxide film; etching the center part of the polycrystal silicon film by a predetermined depth and forming a trench in the polycrystal silicon film; forming a low work function material layer in the trench of the polycrystal silicon film; and a forming a protective film on the low work function material layer.

The forming of the cathode member may include: forming a silicon oxide film on the micro heater member and planarizing the silicon oxide film; forming a polycrystal silicon film on the silicon oxide film; forming a cathode using a low work function material layer on an upper center part of the polycrystal silicon film; and forming a protective film on the cathode.

The forming of the gate member may include: forming a first silicon oxide film on the cathode member; forming a polycrystal silicon film on the first silicon oxide film; forming a second silicon oxide film on the polycrystal silicon film; and etching the center part of the second silicon oxide film, the polycrystal silicon film, and the first silicon oxide film using photolithography and exposing the protective film on the cathode of the cathode member.

The forming of the upper structure may include: etching both outer walls of the lower surface of the silicon substrate so as to have a structure where the center part thereof is projected downward; forming a silicon oxide film on the entire lower surface of the silicon substrate; etching and removing a predetermined part of the center of the silicon oxide film and exposing the silicon substrate; and forming an anode on the lower surface of the center part of the silicon oxide film using a metal layer, wherein the anode contacts the silicon substrate through the predetermined part of the center of the silicon oxide film.

The method may further include, after the removing of the material layer: removing the protective film of the low work function material layer in the micro heater member and the protective film on the cathode of the cathode member; and etching the lower center part of the motherboard and exposing the silicon oxide film of the micro heater member.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
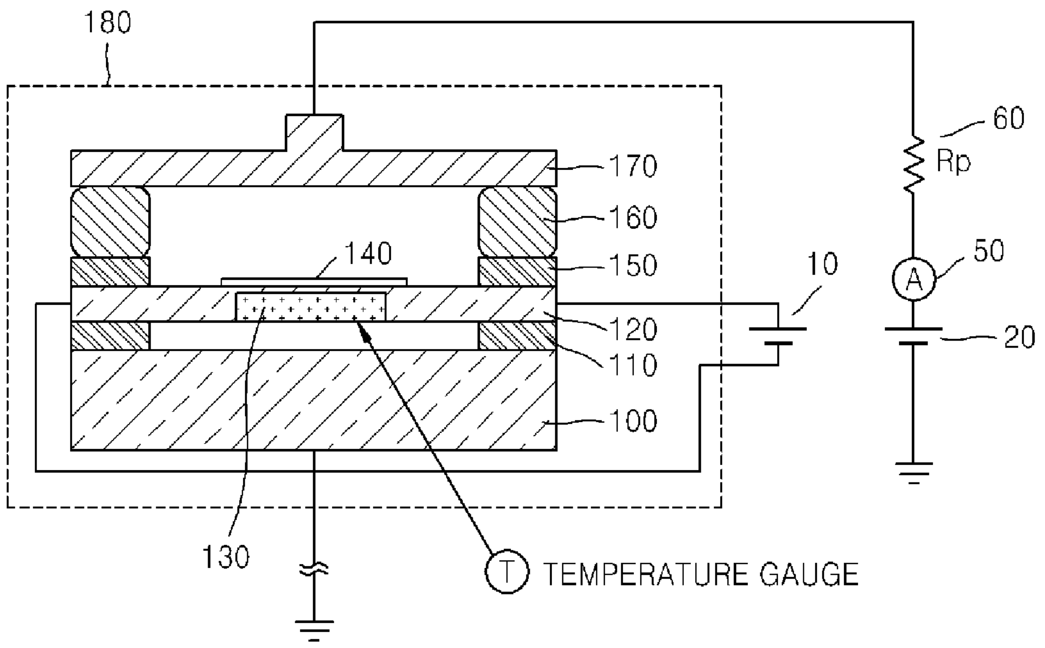
FIG. 1A is a cross-sectional view of a cathode-anode device, that is, a diode device, having a bipolar vacuum tube structure, according to an embodiment of the present invention.

The present invention will now be described more fully with reference to the accompanying drawings, in which exemplary embodiments of the invention are shown. In the description, when it is described that an element is disposed on another element, the element may be directly disposed on the other element or a third element may be interposed therebetween. In the drawings, the thicknesses of layers and regions are exaggerated for clarity. Like reference numerals in the drawings denote like elements. The terminology used herein is for the purpose of describing exemplary embodiments only and is not intended to be limiting of example embodiments. In the description, the detailed descriptions of well-known technologies and structures may be omitted so as not to hinder the understanding of the present invention.

Thermionic emission is a method of generating free electrons and has been widely studied. According to the classical literature [W. B. Nottingham, Thermionic Emission In "Handbuch der Physik"(S. Flugge ed.), Vol. 21, pp. 1-175, Springer-Verlag. Berlin, 1956.], a thermionic emission state may be represented by a Richardson equation shown in (1).

$$J(T)=120.4\ \text{A cm}^{-2}\text{K}^{-2}T^2\exp(-\phi/\kappa T)[\text{A/cm}^2] \quad (1)$$

Wherein, T is absolute temperature and k is the Boltzmann constant of $8.6\times10^{-5}$ eV/K. A work function, ϕ, is changed according to temperature. For example, in barium oxide having a low work function of about 1.2 eV, thermal electrons are emitted at a temperature of about 1000 K.

FIG. 1A is a cross-sectional view of a cathode-anode device, that is, a diode device having a bipolar vacuum tube structure, according to an embodiment of the present invention.

Figure 4:
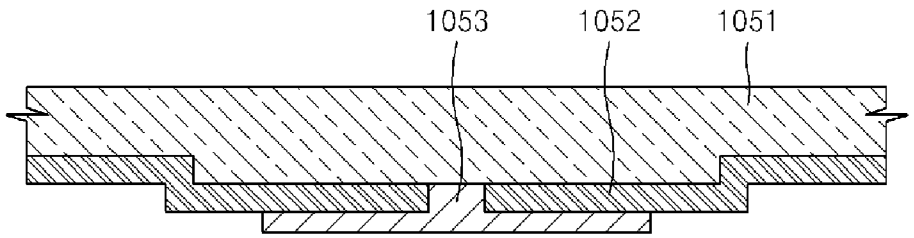
FIG. 4 is a cross-sectional view of an upper structure of the vacuum channel transistor of FIG. 2.

Referring to FIG. 1A, a cathode electrode film 120 and an anode electrode film 170 are formed on a motherboard 100 formed of silicon, in the cathode-anode device having a bipolar vacuum tube structure. The cathode electrode film 120 is spaced apart from the motherboard 100 by a predetermined distance though silicon oxide films 110 disposed on both lower parts of the cathode electrode film 120. The anode electrode film 170 is spaced apart from the cathode electrode film 120 by a predetermined distance though silicon oxide films 150 and spacers 160 sequentially disposed on both upper parts of the cathode electrode film 120. Here, the cathode electrode film 120 may be formed of a polycrystal silicon film and the anode electrode film 170 may be formed of a metal film such as nickel. In FIG. 1A, the anode electrode film 170 is a single layer. However, as illustrated in FIG. 4, the anode electrode film 170 may be formed by coating a metal layer on a silicon substrate, as will be described more fully in FIG. 4.

A local micro heater 130 is formed in the cathode electrode film 120 and a low work function material layer 140 is formed on a part of the upper surface of the cathode electrode film 120 so that heat is generated through the local micro heater 130 and electrons are easily emitted from the low work function material layer 140.

The cathode-anode device having a bipolar vacuum tube structure is formed in a high vacuum chamber 180. Accordingly, the space between the cathode electrode film 120 and the anode electrode film 170 functions as a vacuum electron passing area, that is, a vacuum channel. Also, power sources are connected to the cathode-anode device having a bipolar vacuum tube structure. As illustrated in FIG. 1A, a first power source 20 that applies a direct current (DC) voltage between an anode and an cathode is connected to the anode electrode film 170, and a second power source 10 that applies a voltage to the local micro heater 130 is connected to both sides of the cathode electrode film 120. Here, the motherboard 100 is connected to ground. Also, a protective resistor Rp 60 for protecting the cathode-anode device and a current meter 50 for measuring passing current may be connected to the front end of the first power source 20.

In the cathode-anode device, a plane-type low work function thermal cathode electrode structure is used in order to remove the instability of electric field emission due to a abrasion of the tip in a conventional sharp cold cathode tip structure at a high electric field state and thus the stability of emitted current and operation may be secured. The low work function material layer 140 may include, for example, diamond or Diamond-Like Carbon (DLC) and barium oxide. Also, the low work function material layer 140 may include all materials having low work function characteristics.

In addition, the local micro heater 130 included in the cathode electrode film 120 is heated so as to emit thermal electrons from the low work function material layer 140 disposed on the local micro heater 130, or the cathode electrode film 120 is directly or indirectly heated so as to increase the current density emitted from the cathode electrode film 120.

As the temperature of the low work function material layer 140 disposed on the cathode electrode film 120 increases, electrons in a covalent bond obtain energy to be free electrons. Thus, a large amount of electrons may be emitted from the low work function material layer 140 with a low driving voltage.

Figure 1B:
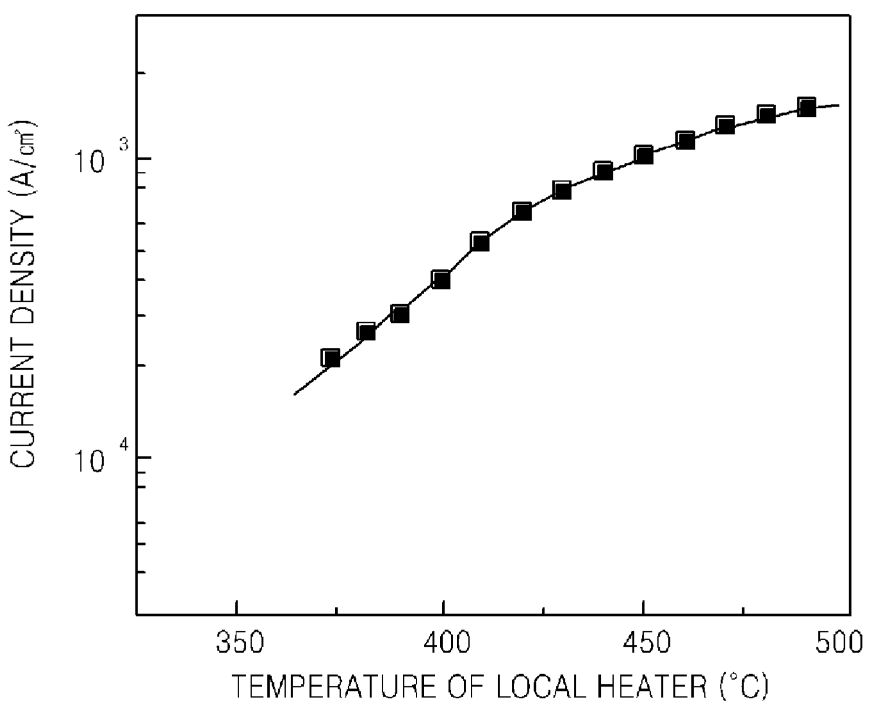
FIG. 1B is a graph illustrating the increase of current density according to temperature change in the cathode-anode device of FIG. 1A.

FIG. 1B is a graph illustrating the increase of current density according to temperature change in the cathode-anode device of FIG. 1A.

The graph is obtained under the conditions that DLC is used in the low work function material layer 140 and the DLC is deposited on the upper surface of the local micro heater 130 using plasma-enhanced chemical vapor deposition (PECVD) to have a thickness of about 1 um. Then, the deposited DLC is heat treated at about 600° C. In addition, a predetermined voltage is applied to the local micro heater 130 through both sides of the cathode electrode film 120, thereby generating Joule's heat in the local micro heater 130 and increasing the temperature of the local micro heater 130. Thus, current density according to temperature change is measured until a temperature of about 500° C.

As illustrated in the graph, the current density exponentially increases according to the temperature change. Although not illustrated in the graph, when an interval between the cathode electrode film 120 and the anode electrode film 170 may be decreased due to thermal electron emission, the driving voltage may be decreased.

The cathode-anode bipolar diode device according to the present embodiment of the present invention employs a new plane structure as the cathode and includes the local micro heater 130 in the cathode electrode film 120, thereby realizing a diode device being operable at low temperature and with a low driving voltage.

Figure 2:
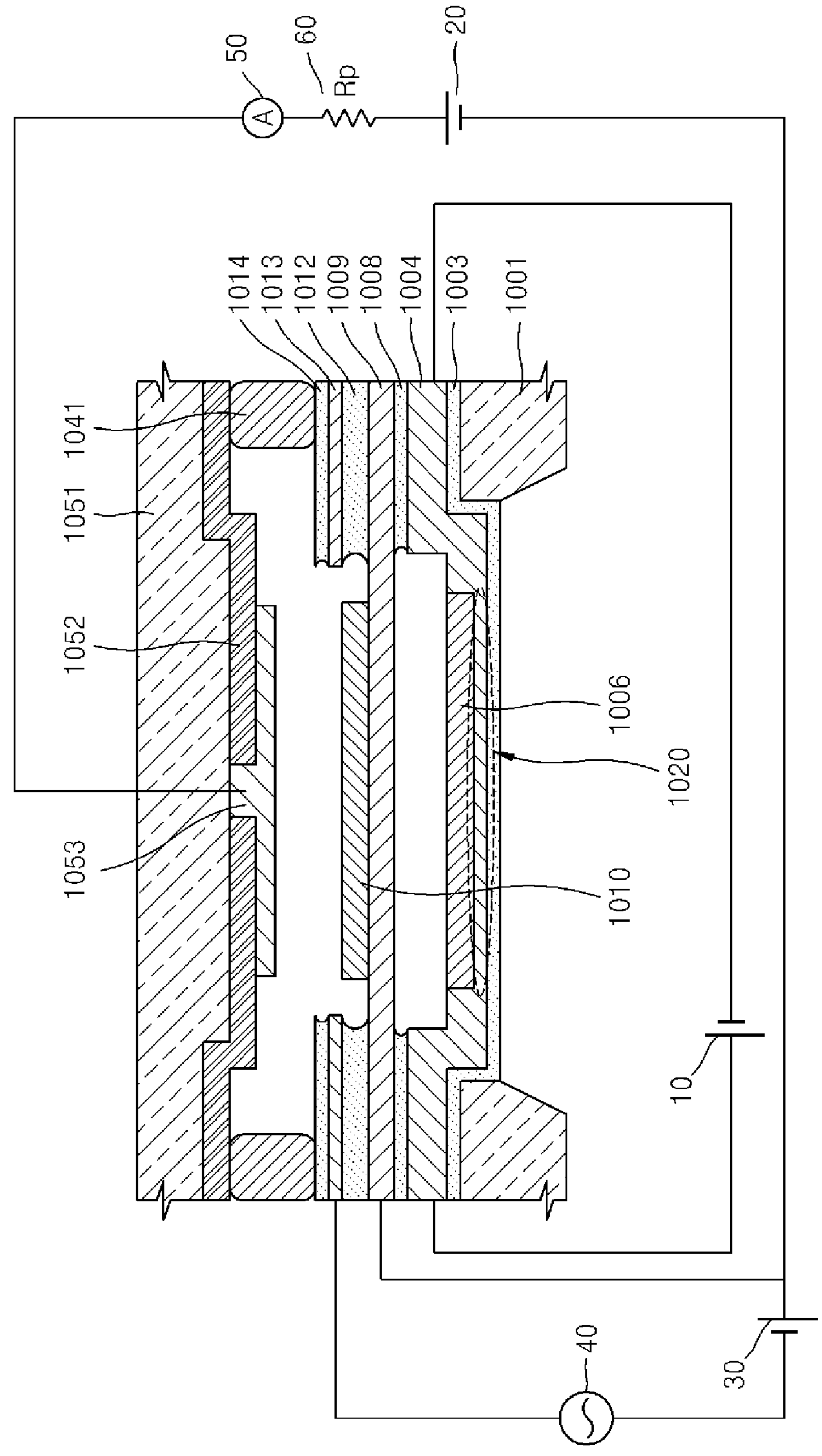
FIG. 2 is a cross-sectional view of a vacuum channel transistor according to an embodiment of the present invention.

FIG. 2 is a cross-sectional view of a vacuum channel transistor according to an embodiment of the present invention.

Referring to FIG. 2, the vacuum channel transistor according to the present embodiment of the present invention includes a silicon motherboard 1001, a micro heater member, a cathode member, a gate member, and an anode member.

The micro heater member is formed on the motherboard 1001 and includes a silicon oxide film 1003, a polycrystal silicon film 1004, and a low work function material layer 1006 that are sequentially formed on the motherboard 1001. The micro heater member is formed as a thin film system having a structure where a center part is projected downward, that is, a membrane structure. The lower center part of the motherboard 1001 is etched and removed so that a lower part of the micro heater member, that is, a portion of the silicon oxide film 1003, is exposed in the lower center part of the motherboard 1001.

In addition, the center part of the polycrystal silicon film 1004 has a smaller thickness than that of the outer wall of the polycrystal silicon film 1004, so as to function as a local micro heater. The polycrystal silicon film 1004 may be formed of a doped polysilicon film having a resistance value of about 10 Ω/square. Also, a conductive material such as platinum Pt may be used instead of the polycrystal silicon of the polycrystal silicon film 1004. The center part of the polycrystal silicon film 1004 functioning as the local micro heater may have a rectangular plane structure or a zigzag-shaped plate structure, as will be described with reference to FIG. 6.

The low work function material layer 1006 is deposited on the center part, that is, the part having a smaller thickness than that of the outer wall of the polycrystal silicon film 1004, of the polycrystal silicon film 1004. The low work function material layer 1006 may be formed of diamond, DLC, or a material film, such as barium oxide, having a low work function.

The cathode member is formed on the micro heater member and includes a polycrystal silicon film 1009 and a cathode 1010 of the low work function material layer. The cathode member is stacked on a silicon oxide film 1008 formed on both sides of the micro heater member. The cathode 1010 is formed on the center part of the polycrystal silicon film 1009 by coating a low work function material layer, for example, diamond, DLC, or barium oxide, thereon.

Since the center part of the micro heater member is projected downward, the center part of the cathode member is spaced apart from the center part of the cathode member by a predetermined interval.

The gate member is formed on both outer walls of the upper parts of the cathode member and includes a first silicon oxide film 1012, a crystal silicon gate 1013, and a second silicon oxide film 1014 that are sequentially formed on both outer walls of the upper parts of the cathode member.

In addition, the anode member is formed on the gate member and includes an upper silicon substrate 1051, a silicon oxide film 1052, and an anode 1053. The center part of the silicon substrate 1051 is projected downward. The silicon oxide film 1052 is formed on a lower surface of the silicon substrate 1051 but the silicon oxide film 1052 is not formed on a predetermined part of the center part of the silicon substrate 1051. The anode 1053, formed of a material layer such as nickel, is formed on the lower surface of the center part of the silicon oxide film 1052 and on the predetermined part of the center part of the silicon substrate 1051. The anode 1053 is contacted to the silicon substrate 1051 through the part where the silicon oxide film 1052 is not formed. The anode member is stacked on the gate member through spacers 1041. The spacers 1041 are formed of an insulation material and the height of the spacers 1041 may be adjusted according to the characteristics of the vacuum channel transistor. Since the anode member is spaced apart from the cathode member by a predetermined interval through the spacers 1041, the space between the cathode member and the anode member functions as a vacuum electron passing area, that is, a vacuum channel area.

In addition, a first power source 10, a second power source 20, and a third power source 30 are connected to the vacuum channel transistor, wherein the first power source 10 applies a voltage to the local micro heater of the micro heater member, the second power source 20 applies a voltage to the cathode 1010 and the anode 1053, and the third power source 30 applies a voltage to the cathode 1010 and the crystal silicon gate 1013. Also, a protective resistor Rp 60 and a current meter 50 may be connected to the front end of the second power source 20 and a signal source 40 may be connected between the cathode 1010 and the crystal silicon gate 1013.

The vacuum channel transistor according to the present embodiment of the present invention is operated as follows.

When the first power source 10 applies a voltage to both ends of the polycrystal silicon film 1004 of the micro heater member, the temperature of the micro heater increases and thereby thermal electrons are emitted. Thus, the emitted thermal electrons are collected around a center part of the cathode member, which are disposed on the upper part of the micro heater. Also, when the third power source 30 applies a voltage between the crystal silicon gate 1013 of the gate member and the polycrystal silicon film 1009 of the cathode member, electrons are emitted from the cathode 1010 and the emitted electrons are transmitted to the anode 1053 by a potential difference generated by the voltage applied between the anode 1053 and the polycrystal silicon film 1009. Here, the gate member includes an electron passing area so as for the electrons emitted from the cathode 1010 to reach the anode 1053. That is, the electron passing area is defined by the gate member for not preventing the transmission of electrons between the cathode 1010 and the anode 1053. In order not to prevent electron transmission, the crystal silicon gate 1013 may be applied, for example, positive potential at a part thereof.

Here, the electrons may pass through the positive potential area and may be transmitted from the cathode 1010 to the anode 1053. Also, the crystal silicon gate 1013 may include, for example, one or more control gates. Here, the electrons may be transmitted from the cathode 1010 to the anode 1053 without interference by the crystal silicon gate 1013. In this case, an area in which electrons may pass through a cross-section of the crystal silicon gate 1013 is referred to as the electron passing area.

When a voltage or current is applied to the polycrystal silicon film 1004 of the micro heater member, the temperature of the center part of the polycrystal silicon film 1004, that is, the local micro heater, increases. Through convection or radiation generated due to the temperature increase, the temperature of the polycrystal silicon film 1009 in the cathode member increases so as to promote electron emission from the cathode 1010.

In addition, the cathode member and the micro heater member are spaced apart from each other by a predetermined interval so that change in all of the electrical characteristics of the vacuum channel transistor due to the electrical characteristics of the local micro heater of the polycrystal silicon film 1004 may be minimized.

The vacuum channel transistor according to the present embodiment of the present invention is a vacuum transistor in which a tripod-type vacuum tube arranged in series is embodied on a semiconductor substrate. Accordingly, electron emission from the cathode electrode in vacuum is theoretically considered as follows.

Electron emission from a metal to a vacuum is caused by electron movement due to the tunneling effect generated by the decrease of the height and the width of a potential barrier of a metal surface due to a significantly high electric field. The general intensity of the electric field required to emit the electrons from the metal to a vacuum is 109 [V/m] or above. In general, the metal may include pure metals and may have a work function of about 3 to about 5 eV. However, a specific metal compound or diamond or DLC as a non-metal has a low work function and has an emission current having a similar magnitude as a general metal in an electric field of about 107 to about 108 [V/m]. The micro heater member, on which a metal film having a low work function is coated, is heated to about 450 to about 500° C. and is used, and thus, a thermal electron emission-type transistor operable in a low voltage may be manufactured.

The current density of the electrons emitted from the metal to a vacuum is obtained by the Fowler-Nordheim equation [R. H. Fowler and L. W. Nordheim, "Electron Emission in Intense Fields," Proc. R. Soc., London A119, 173, 1928.] defined in (2) below.

$$J=aV^2\exp(-b/V)[\mathrm{A/cm^2}] \quad (2)$$

wherein, a is $1.5\times10^{-6}$ $(A/\phi)\exp(10.4/\phi^{1/2})\beta$, b is $6.44\times10^7\phi^{3/2}/\beta$, V is a potential difference, A is an emission area ($cm^2$), $\phi$ is a potential difference (eV) corresponding to a work function of a metal, and b represents a Geometric Factor dependent upon a structure of an electrode.

The magnitude of the current is determined by the electrons emitted from the cathode 1010. An emission amount of the electrons varies according to the intensity of an electric field at the edge of the cathode electrode adjacent to the gate electrode and a size of a work function of the metal forming the cathode 1010. Accordingly, in order to increase the current density, a material having a low work function may be used, the radius of curvature of the edge of the cathode electrode may be decreased, the voltage of the cathode-gate may be increased, and the intensity of the electric field may be increased.

However, when tungsten W or molybdenum Mo is used as a cathode electrode material, a work function is about 4.5 eV and thus a significantly high voltage is needed for field emission. Accordingly, an electrode having a sharp tip structure is required. When the cathode 1010 is formed of diamond or DLC each having a very low work function, a desired current density may be obtained in the electric field having a very low intensity. Also, the cathode 1010 may be formed of an electric conductor having excellent conductivity, such as platinum Pt, and the low work function material layer 1006 disposed on the cathode 1010 may be used as an electron emitting layer.

Materials such as carbon-based diamond or DLC each having a low work function, chemical stability, heat and electrical conductivity, and stability at high temperatures may be coated on the surface of the cathode 1010 so as to improve the stability of electron emission and emission characteristics.

Examples of materials having a low work function used in the present embodiment may include carbon-based diamond, DLC, barium oxide, and any material having above-described characteristics.

In addition, the cathode 1010 may be directly or indirectly heated so as to increase the current density emitted from the cathode 1010. As the temperature of the cathode 1010 increases, electrons in a covalent bond obtain energy to be free electrons. Thus, a large amount of electrons may be emitted with a low driving voltage.

The vacuum channel transistor described according to the present embodiment of the present invention includes the membrane-form micro heater member on the lower part thereof, wherein the temperature of the vacuum channel transistor increases through the micro heater member so as to easily emit thermal electrons. Also, the low work function material layer 1006 such as DLC is stacked in the micro heater member so that the temperature of thermal electron emission decreases and thus thermal electron emission is facilitated. In addition, the cathode member and the silicon motherboard 1001 may be spaced apart from each other. Accordingly, the local micro heater does not directly transmit heat to a part, except to the cathode member disposed on the upper part thereof and thus the temperature of other elements of the vacuum channel transistor is not affected.

Figure 3A:
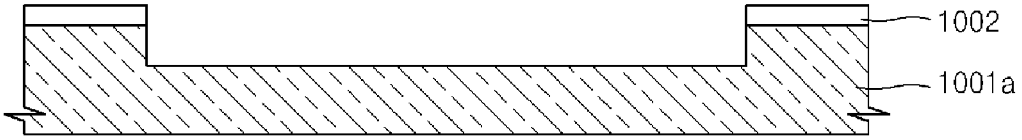
FIGS. 3A through 3P are cross-sectional views for describing a process of manufacturing a lower structure of the vacuum channel transistor of FIG. 2.
Figure 3B:
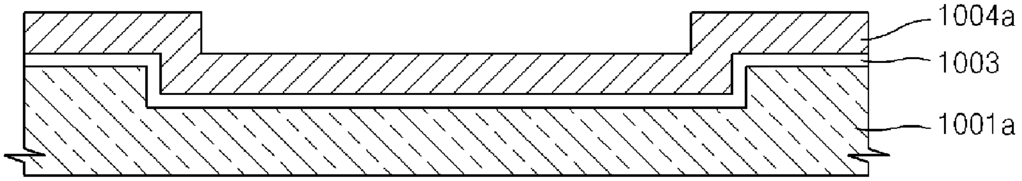
Figure 3C:
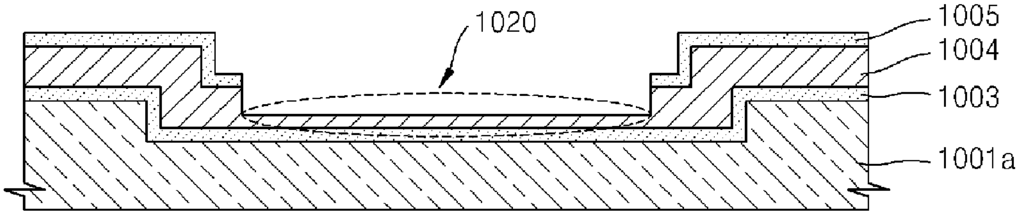
Figure 3D:
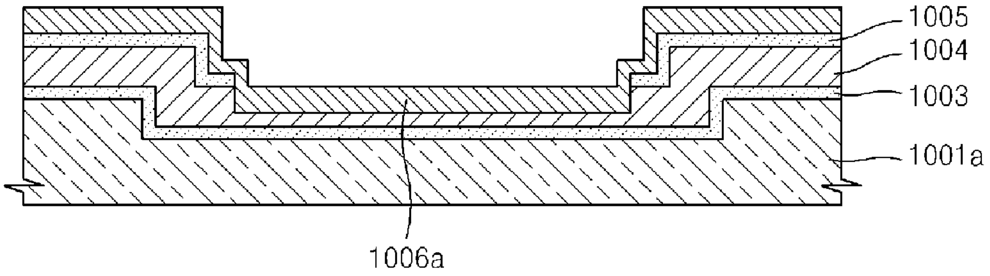
Figure 3E:
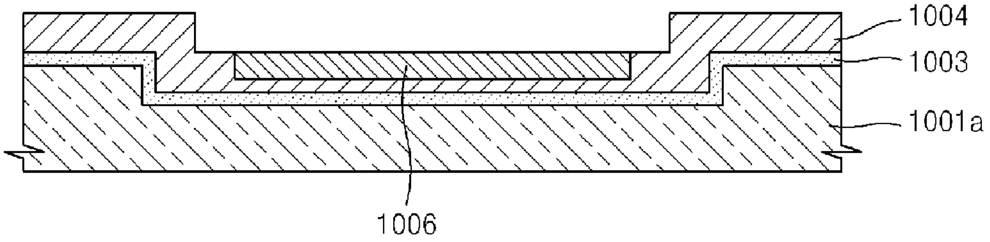
Figure 3F:
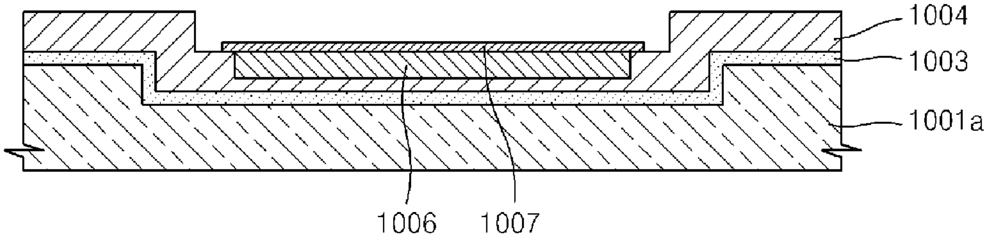
Figure 3G:
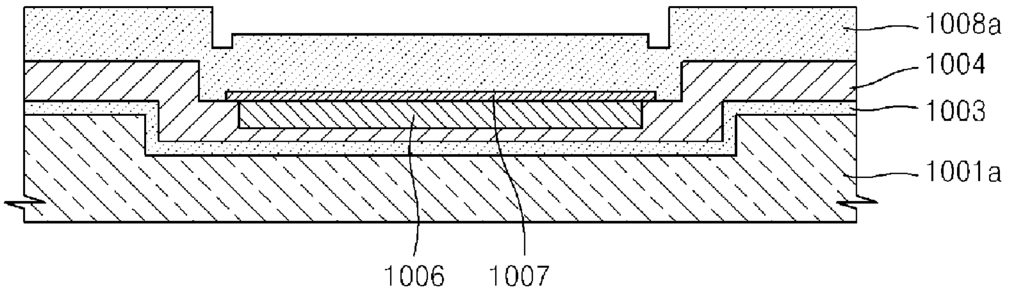
Figure 3H:
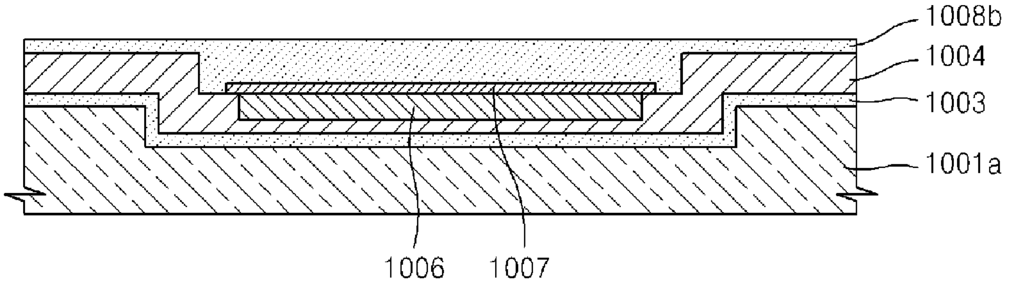
Figure 3I:
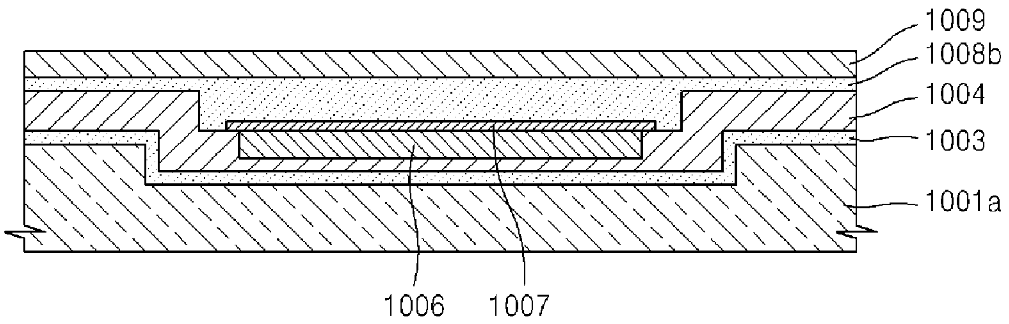
Figure 3J:
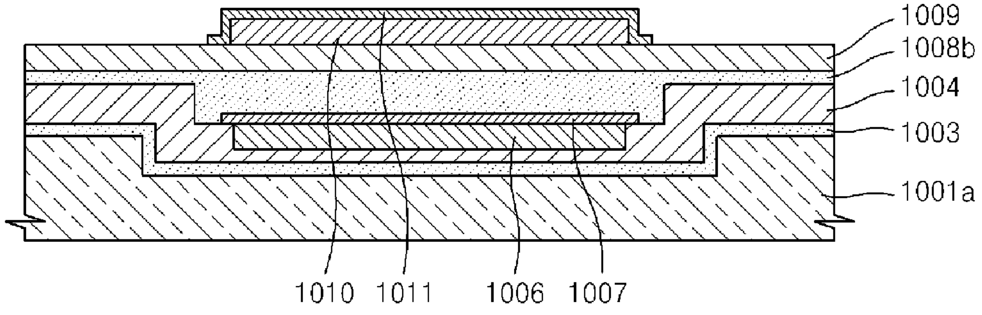
Figure 3K:
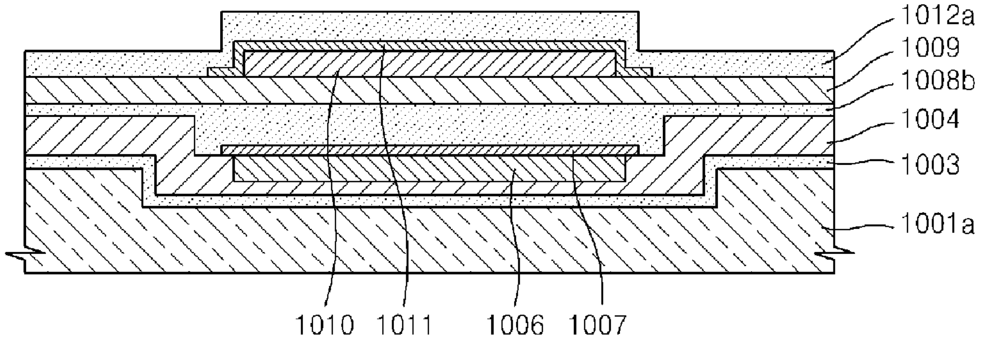
Figure 3L:
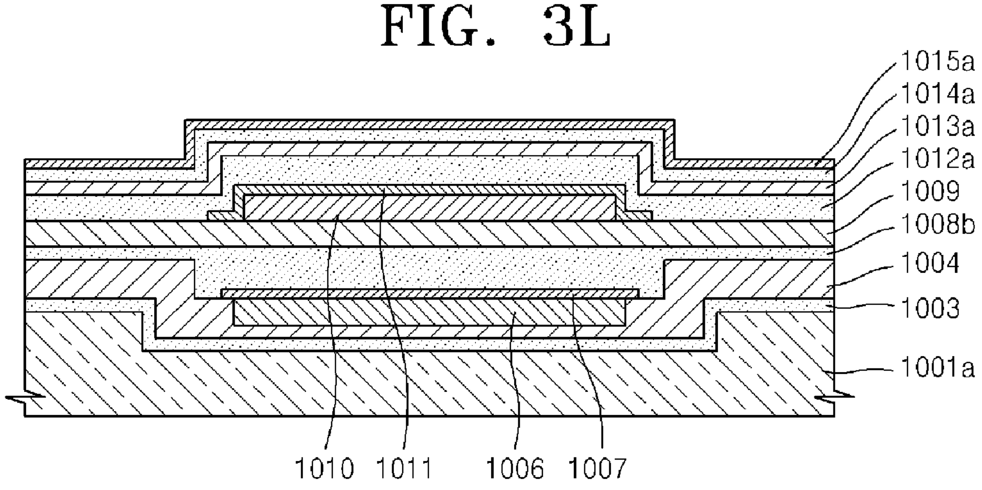
Figure 3M:
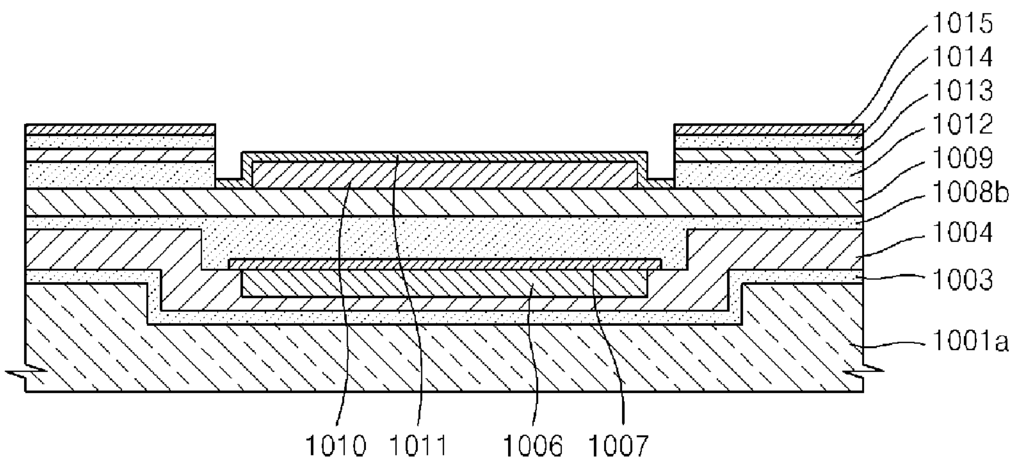
Figure 3N:
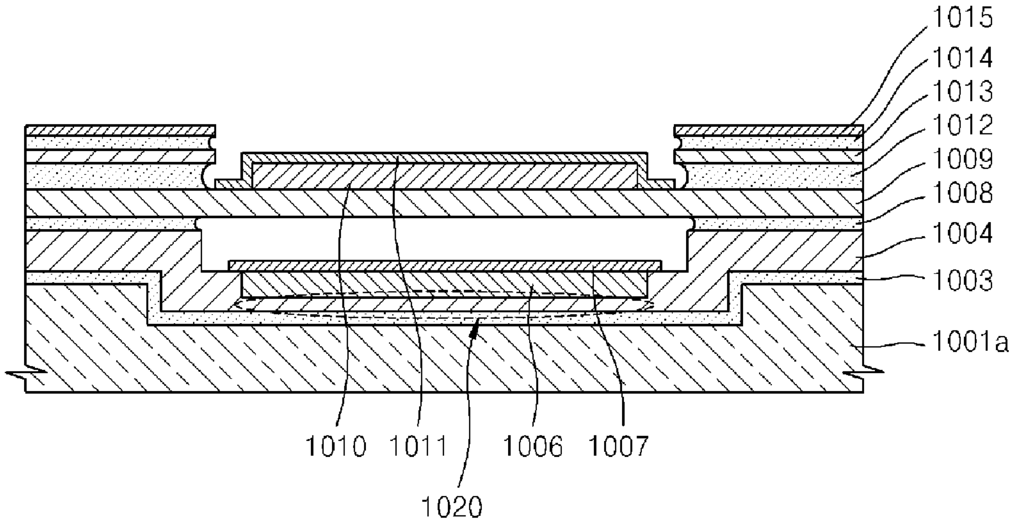
Figure 3O:
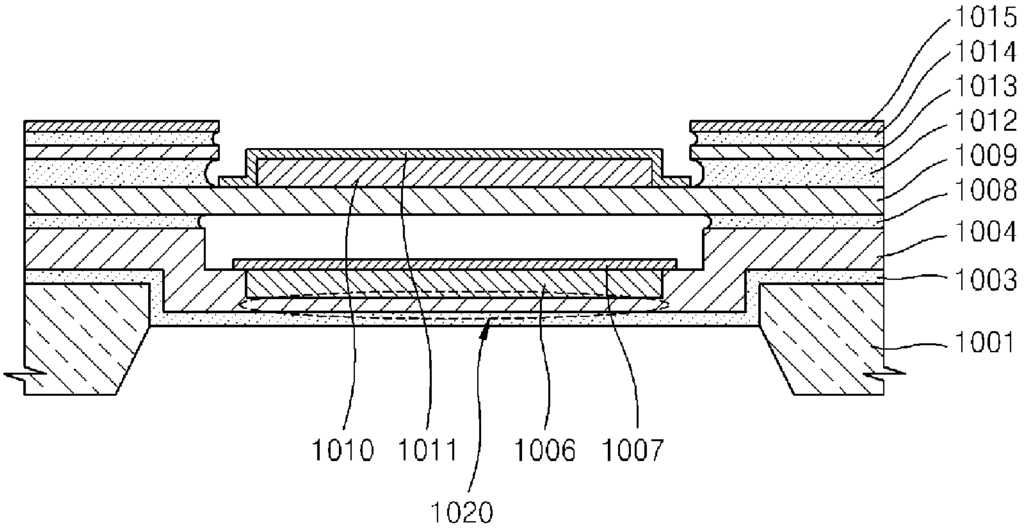
Figure 3P:
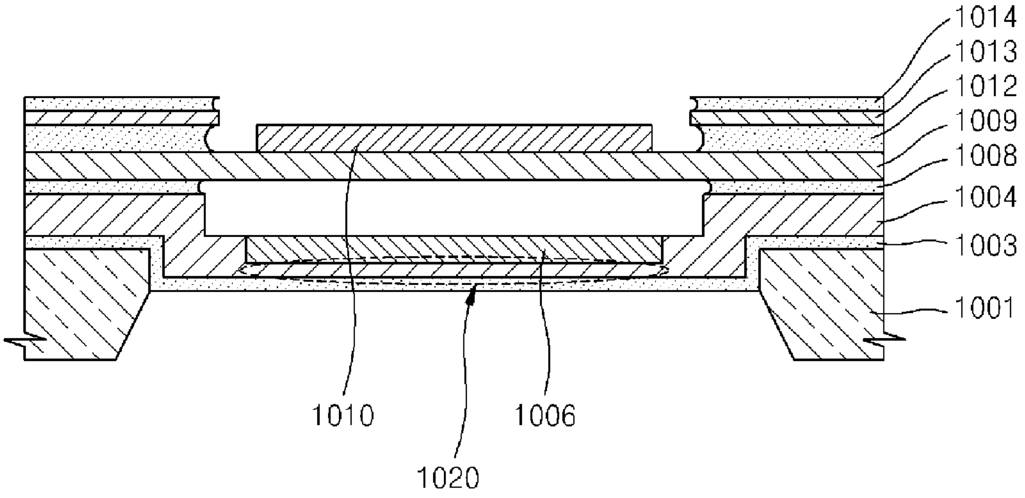

FIGS. 3A through 3P are cross-sectional views for describing a process of manufacturing a lower structure of the vacuum channel transistor of FIG. 2. In the entire processes, a pattern mask is used in each operation of the process and a silicon wafer is used as a substrate.

Referring to FIG. 3A, a trench pattern is formed on the surface of a motherboard 1001*a*, formed of silicon, using a photosensitive film or photo-resist 1002. That is, in order to manufacture the lower structure of the vacuum channel transistor of FIG. 2, the photosensitive film 1002 is coated on the motherboard 1001*a* and an active area is defined thereon. Then, the active area is dry etched to a thickness of 8 to 10 um, thereby forming the trench pattern.

Referring to FIG. 3B, the remaining photosensitive film 1002 is removed and the motherboard 1001*a* is washed. Then, a silicon oxide film 1003 having a thickness of about 1 um and the polycrystal silicon film 1004 doped with impurities and having a thickness of about 4 to about 5 um are sequentially grown using low pressure chemical vapor deposition (LPCVD) or plasma-enhanced chemical vapor deposition (PECVD) at a temperature of 1100° C.

The polycrystal silicon film 1004 functions as a wiring layer of the micro heater member.

Referring to FIG. 3C, a photosensitive film 1005 coated on the polycrystal silicon film 1004 is patterned so as to form a local micro heater 1020. Then, the resultant structure is heated for about 30 minutes or above in a vacuum furnace at 450° C. or an electric furnace under $N_2$ atmosphere so as to remove moisture that remained on the surface of the resultant structure and the polycrystal silicon film 1004 is dry etched so as to reduce the thickness of the center part of the polycrystal silicon film 1004 to about 2 to 3 μm. Here, in order for the center part of the polycrystal silicon film 1004 to be used as the local micro heater 1020, a doped polysilicon film having a resistance value of about 10 Ω/square may be used. Also, other materials such as platinum Pt may be used to form the local micro heater 1020.

Referring to FIG. 3D, a low work function material layer 1006*a* is deposited on the entire surface of the resultant structure to have a thickness of about 300 to 3000 nm using PECVD. Here, a carbon-based diamond thin film or a DLC thin film having a low work function may be used as the low work function material layer 1006.

Referring to FIG. 3E, since the carbon-based diamond thin film or the DLC thin film is hardly removed by dry etching or wet etching after patterning using resist, the carbon-based diamond thin film or the DLC thin film is removed using a lift-off patterning. The low work function material layer 1006 may be formed on the local micro heater 1020 using the DLC thin film.

Referring to FIG. 3F, in order to prevent the low work function material layer 1006 from being exposed during the process, a silicon nitride film 1007, which is a protective film formed of an insulator, is deposited on the low work function material layer 1006 in a single-layer or a multi-layer to have a thickness of about 100 to 200 nm and the silicon nitride film 1007 is removed except for a part of the silicon nitride film 1007 disposed on the low work function material layer 1006 using lithography patterning.

Referring to FIG. 3G, a silicon oxide film 1008*a* is deposited on the resultant structure to have a thickness of about 4 to 5 um using PECVD.

Referring to FIG. 3H, in order to reduce the surface roughness of the silicon oxide film 1008*a*, the silicon oxide film 1008*a* is polished and planarized using chemical-mechanical polishing (CMP) so as to form a low-temperature silicon oxide film 1008*b*.

Referring to FIG. 3I, an abrasive is removed and the resultant structure is washed. Then, polysilicon is deposited on the entire upper surface of the resultant structure using LPCVD to have a thickness of about 2 to about 3 μm so as to form a doped polycrystal silicon film 1009. The polycrystal silicon film 1009 functions as a wiring layer of a cathode member. Then, the resultant structure is post-annealed for about 2 hours in an electric furnace under $N_2$ atmosphere at 500° C. and compressive stress applied to the polycrystal silicon film 1009 is relaxed.

Referring to FIG. 3J, a carbon-based diamond thin film or a DLC thin film each having a low work function is deposited on the entire upper surface of the polycrystal silicon film 1009 of the cathode member to have a thickness of about 300 to 3000 nm using PECVD so as to form the cathode 1010 of a low work function material layer. As described above, since the carbon-based diamond thin film or the DLC thin film is hardly removed by dry etching or wet etching after patterning using resist, a predetermined part of the center part of the carbon-based diamond thin film or the DLC thin film remains and other parts of carbon-based diamond thin film or the DLC thin film are removed using a lift-off patterning. The cathode 1010 of the low work function material layer is formed using the DLC thin film. Then, a silicon nitride film 1011, which is a protective film formed of an insulator, is deposited on the cathode 1010 in a single-layer or a multi-layer to have a thickness of about 100 to 200 nm and the silicon nitride film 1011 is removed except for a part of the silicon nitride film 1011 disposed on the cathode 1010 using lithography patterning.

Referring to FIG. 3K, a first low-temperature silicon oxide film 1012*a* having a thickness of about 2 to 3 μm is deposited on the resultant structure using LPCVD so as to be used as an insulator film.

Referring to FIG. 3L, a doped polycrystal silicon film 1013*a* having a thickness of about 2 to 3 μm is deposited on the first silicon oxide film 1012*a* using LPCVD. A second silicon oxide film 1014*a*, which is an insulator film, is deposited on the polycrystal silicon film 1013*a*. Then, a low-temperature silicon nitride film 1015*a* as a protective film is deposited on the upper surface of the second silicon oxide film 1014*a* to have a thickness of about 100 to 200 nm using PECVD.

Referring to FIG. 3M, a photosensitive film is coated on the low-temperature silicon nitride film 1015*a*, and is patterned, thereby defining an exposure area. The low-temperature silicon nitride film 1015 is dry etched or wet etched so as to form an exposure area and the photosensitive film is removed. Then, the second silicon oxide film 1014*a*, the polycrystal silicon film 1013*a* and the first silicon oxide film 1012*a* are removed using anisotropic dry etching until the protective film of the silicon nitride film 1011 disposed on the upper surface of the cathode 1010 of the low work function material layer is exposed. Here, the polycrystal silicon film 1013*a* remained after etching forms a crystal silicon gate 1013. Also, the low-temperature silicon nitride film 1015, the second silicon oxide film 1014, the polycrystal silicon film 1013, and the first silicon oxide film 1012 are the layers remained after etching.

Referring to FIG. 3N, in order to form a space between the upper part of the local micro heater 1020 and the lower part of the silicon oxide film 1009 of the cathode member into a cavity, etching of the silicon oxide film 1008*a*, etching of an opening, and exposing the protective film of the silicon nitride film 1011 are simultaneously illustrated. The low-temperature silicon oxide film 1008*a* is removed using wet etching or gas phase etching (GPE) so as to form a cavity part in the center and thus the transmission of heat generated from the local micro heater 1020 is blocked. In GPE, the low-temperature silicon oxide film 1008*a* is removed by a HF etching reaction at a gas phase after inserting a silicon wafer into a GPE equipment, adjusting the substrate temperature to about 22 to 35° C. and the pressure of a reactor to about 10 to 100 Torr, and flowing anhydrous HF and $CH_3OH$ process gas.

Referring to FIG. 3O, a silicon nitride film is deposited on the rear surface of the motherboard 1001 to have a thickness of about 200 nm using CVD, the photosensitive film is coated on the silicon nitride film, which is a protective film, a part to be etched in the silicon nitride film is defined using the photosensitive film patterning, the silicon nitride film is removed until a bulk silicon layer is exposed, and the bulk silicon layer is immersed in a KOH solution and is wet etched. Here, bulk silicon is removed until the silicon oxide film 1003 disposed on the lower part of the local micro heater 1020 is exposed. As such, since the lower surface of the motherboard 1001 is etched, the local micro heater 1020 has a membrane structure.

Referring to FIG. 3P, the silicon nitride films 1007 and 1011, which are protective films and function as a mask in a prior process, are removed. A phosphoric acid ($H_3PO_4$) solution is used to remove the silicon nitride films 1007 and 1011 so as to expose the low work function material layers 1006 and 1010 and the resultant structure is washed using deionized (DI) water, thereby completing the manufacture of the lower structure of the vacuum channel transistor.

FIG. 4 is a cross-sectional view of an upper structure of the vacuum channel transistor of FIG. 2.

Referring to FIG. 4, the upper silicon substrate 1051 as the main element of the upper structure doped with high concentration impurities is etched so as for the center part thereof to be projected downward by a depth of about 5 um and a thermal oxide film or a low-temperature oxide film as the silicon oxide film 1052 is formed on the upper silicon substrate 1051 to have a thickness of about 1 to 2 um. Here, a predetermined part of the center of the silicon oxide film 1052 is removed using a photolithography process.

Then, nickel Ni is deposited on the silicon oxide film 1052 to have a thickness of about 2 um using sputtering or evaporation and the predetermined part of the nickel layer is removed using a photolithography process, thereby forming the anode 1053. Here, the anode 1053 and the upper silicon substrate 1051 are connected through the predetermined part of the center of the silicon oxide film 1052.

Figure 5:
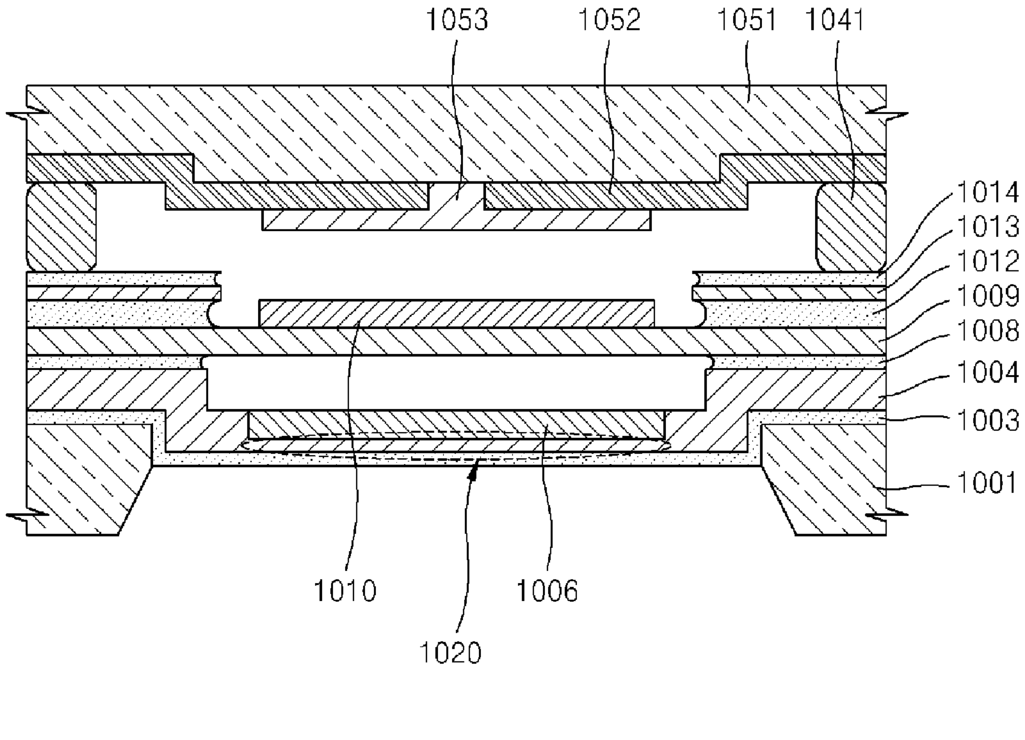
FIG. 5 is a cross-sectional diagram of the vacuum channel transistor of FIG. 2, illustrating the combination of the upper structure of FIG. 4 and the lower structure of FIG. 3P.

FIG. 5 is a cross-sectional view of the vacuum channel transistor of FIG. 2, illustrating the combination of the upper structure of FIG. 4 and the lower structure of FIG. 3P. In FIG. 5, the lower structure of FIG. 3P and the upper structure of FIG. 4 are combined so as to be spaced apart from each other by the spacers 1041.

Referring to FIG. 5, the upper structure, in which anode 1053 is formed, is arranged for the center part of the anode 1053 to face the cathode 1010 in the lower structure. Here, the height of the spacers 1041 may be adjusted according to characteristics of the vacuum channel. The spacers 1041 may be formed by electroplating polyimide or nickel Ni spacers which enable insulation.

The spacers 1041 are disposed on the upper surface of the lower structure, and the upper structure is stacked on the spacers 1041, thereby completing the manufacture of the vacuum channel transistor.

Figure 6:
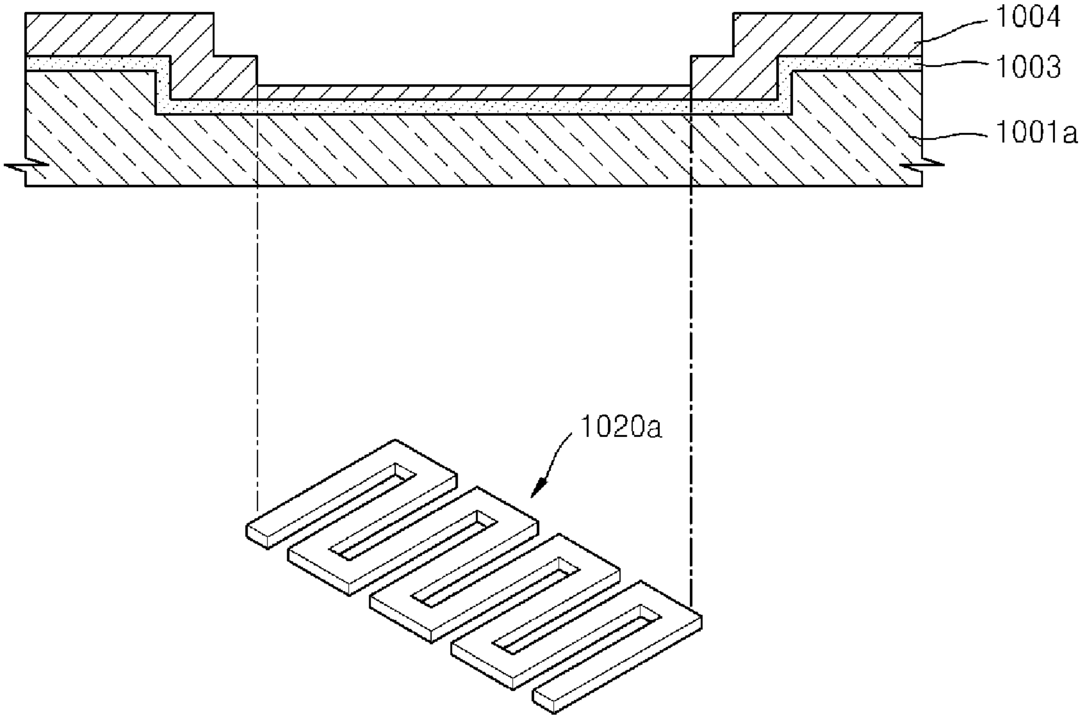
FIG. 6 is a cross-sectional view and a perspective view respectively illustrating the lower structure of the vacuum channel transistor and a local micro heater, according to an embodiment of the present invention.

FIG. 6 is a cross-sectional view and a perspective view respectively illustrating the lower structure of the vacuum channel transistor and the local micro heater 1020, according to an embodiment of the present invention.

Referring to FIG. 6, a resistor structure of the local micro heater 1020 according to the present embodiment of the present invention may be a rectangular plane structure as in FIG. 3C. However, as illustrated in FIG. 6, the local micro heater 1020 may also have a zigzag-shaped plate structure.

That is, in an etching process for the polycrystal silicon film 1004 of FIG. 3, a local micro heater having a zigzag-shaped plate structure as the local micro heater 1020*a* of FIG. 6 may be formed. The local micro heater 1020*a* may be used to locally heat the low work function material layer 1006 until the range of about 400 to about 600° C. using platinum Pt, which is a conductive electrode material, or a polysilicon film doped to have a resistance value of about 10 Ω/square. Here, since the surroundings of the edge of the local micro heater 1020*a* have a low resistance value and the center part of the local micro heater 1020*a* has high resistance value, heat is slowly transmitted to a silicon bulk part of motherboard 1001 and local heating is facilitated.

In a vacuum channel transistor and diode emitting thermal cathode electrons, and a method of manufacturing the vacuum channel transistor according to the present invention, electron emission of a cathode is less affected by a voltage of an anode and the electrons may be emitted from the cathode in a lower driving voltage than that of the conventional vacuum field emission device. Thus, the vacuum channel transistor may be operated in a low voltage and the instability of emission current is removed, thereby securing stability.

In addition, the vacuum channel transistor emitting thermal cathode electrons separately includes a local micro heater and the cathode so that electron emission from a cathode source is less affected by a voltage applied to the local micro heater. Furthermore, electrons may be emitted from the cathode source in a lower gate voltage than that of the conventional vacuum field emission device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A vacuum channel transistor comprising:

a motherboard;

a micro heater member having a thin-film structure formed on the motherboard;

a cathode member having a thin-film structure spaced apart from a center part of the micro heater member by a first interval and formed on the micro heater member;

a gate member formed on both outer walls of upper parts of the cathode member; and an anode member spaced apart from the cathode member by a second interval through spacers disposed on the gate member, wherein a vacuum electron passing area is formed between the cathode member and the anode member by the second interval.

2. The vacuum channel transistor of claim 1, wherein a lower center part of the motherboard is removed through etching in order for the micro heater member to have a thin-film structure, wherein the micro heater member comprises a silicon oxide film formed on the motherboard; a polycrystal silicon film formed on the silicon oxide film on which a center part of the polycrystal silicon film has a smaller thickness than that of an outer wall of the polycrystal silicon film; and a low work function material layer formed on the center part of the polycrystal silicon film, and wherein the micro heater member has a structure where the center part thereof is projected downward, a lower center part of the silicon oxide film is exposed by removing a part of the motherboard, and the center part of the polycrystal silicon film functions as a local micro heater.

3. The vacuum channel transistor of claim 2, wherein the center part of the polycrystal silicon has a rectangular plane structure or a zigzag-shaped plate structure and the low work function material layer is deposited on the center part of the polycrystal silicon film so as to have the same upper surface with the outer wall of the polycrystal silicon film.

4. The vacuum channel transistor of claim 1, wherein the cathode member comprises:

a polycrystal silicon film formed on the micro heater member; and a cathode formed on a center part of the polycrystal silicon film using a low work function material layer;

wherein the cathode member is stacked on an upper surface of the micro heater member through a silicon oxide film formed on both outer walls of upper parts of the micro heater member, the micro heater member has a structure where the center part thereof is projected downward, and the low work function material layer of the cathode, which is formed on the micro heater member, and the polycrystal silicon film are spaced apart from each other by the first interval.

5. The vacuum channel transistor of claim 1, wherein the gate member comprises:

a first silicon oxide film formed on both outer walls of the upper parts of the cathode member;

a crystal silicon gate formed on the first silicon oxide film; and a second silicon oxide film formed on the crystal silicon gate.

6. The vacuum channel transistor of claim 1, wherein the anode member comprises:

a silicon substrate having a center part thereof projected downward;

a silicon oxide film formed on a lower surface of the silicon substrate and not formed on a predetermined part of the center part of the silicon substrate; and an anode formed on a lower surface of the center part of the silicon oxide film and on the predetermined part of the center part of the silicon substrate using a metal layer.

7. The vacuum channel transistor of claim 6, wherein the gate member comprises the first silicon oxide film, the crystal silicon gate, and the second silicon oxide film that are sequentially formed on both outer walls of the upper parts of the cathode member, the spacers are formed on the second silicon oxide film, the anode member is stacked on the spacers so that the anode of the anode member and the cathode of the cathode member are spaced apart from each other by the second interval, and thus the electron passing area is formed for electrons emitted from the cathode to reach the anode.

8. A diode having a cathode-anode structure comprising:

a motherboard;

a cathode member having a thin-film structure spaced apart from the motherboard by a first interval and comprising a local micro heater at a center part of the cathode member;

an anode member spaced apart from the cathode member by a second interval through spacers disposed on the cathode member;

wherein a vacuum electron passing area is formed between the cathode member and the anode member by the second interval, wherein the cathode member is spaced apart from the motherboard by the first interval through a silicon oxide film formed on two separate regions of an upper surface of the motherboard, wherein the upper surface of the motherboard has a central region between the two separate regions, and the central region is not covered by the silicon oxide film, and wherein the cathode member comprises: a polycrystal silicon film; the local micro heater formed on the center part of the polycrystal silicon film; and the cathode formed on the center part of the polycrystal silicon film using a low work function material layer, the anode member comprises: a silicon substrate having a center part thereof projected downward; a silicon oxide film formed on a lower surface of the silicon substrate and not on a predetermined part of the center part of the silicon substrate; and an anode formed on a lower surface of the center part of the silicon oxide film and on the predetermined part of the center part of the silicon substrate using a metal layer, and the anode member is stacked on an upper surface of the cathode member through the silicon oxide film formed on both outer walls of the upper parts thereof and the spacers and is spaced apart from the cathode member by the second interval.

* * * * *